US012159933B2

(12) United States Patent
Brazzale et al.

(10) Patent No.: US 12,159,933 B2
(45) Date of Patent: *Dec. 3, 2024

(54) SEMICONDUCTOR DEVICE WITH SEMICONDUCTOR MESAS BETWEEN ADJACENT GATE TRENCHES

(71) Applicant: Infineon Technologies Austria AG, Villach (AT)

(72) Inventors: Anita Brazzale, Villach (AT); Robert Haase, San Pedro, CA (US); Sylvain Leomant, Poertschach am Woerthersee (AT); Harsh Naik, El Segundo, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 18/453,717

(22) Filed: Aug. 22, 2023

(65) Prior Publication Data
US 2023/0395711 A1    Dec. 7, 2023

Related U.S. Application Data

(63) Continuation of application No. 17/352,954, filed on Jun. 21, 2021, now Pat. No. 11,777,026.

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0696* (2013.01); *H01L 29/404* (2013.01);
(Continued)

(58) Field of Classification Search
CPC ............ H01L 29/7813; H01L 29/0696; H01L 29/404; H01L 29/45; H01L 29/4916; H01L 29/495; H01L 29/66734
(Continued)

(56) References Cited

U.S. PATENT DOCUMENTS

2017/0125530 A1    5/2017   Zhang et al.
2017/0162650 A1    6/2017   Cheng et al.
(Continued)

FOREIGN PATENT DOCUMENTS

CN          114823894 A      7/2022
KR          20220045314 A    4/2022

*Primary Examiner* — Mohammad M Hoque
(74) *Attorney, Agent, or Firm* — Murphy, Bilak & Homiller, PLLC

(57) ABSTRACT

A semiconductor device is described. The semiconductor device includes: a semiconductor substrate having a first main surface; a plurality of gate trenches extending from the first main surface into the semiconductor substrate; a semiconductor mesa between adjacent gate trenches; a first interlayer dielectric on the first main surface; a plurality of first metal contacts extending through the first interlayer dielectric and contacting gate electrodes disposed in the gate trenches; a plurality of second metal contacts extending through the first interlayer dielectric and contacting the semiconductor mesas; and an air gap or a dielectric material having a lower dielectric constant than the first interlayer dielectric between adjacent first and second metal contacts. Methods of producing the semiconductor device are also described.

20 Claims, 14 Drawing Sheets

(51) Int. Cl.
    *H01L 29/40*     (2006.01)
    *H01L 29/45*     (2006.01)
    *H01L 29/49*     (2006.01)
    *H01L 29/66*     (2006.01)

(52) U.S. Cl.
    CPC .......... *H01L 29/45* (2013.01); *H01L 29/4916* (2013.01); *H01L 29/495* (2013.01); *H01L 29/66734* (2013.01)

(58) Field of Classification Search
    USPC ....................................................... 257/330
    See application file for complete search history.

(56) References Cited

U.S. PATENT DOCUMENTS

| | | |
|---|---|---|
| 2017/0278837 A1 | 9/2017 | Hsieh |
| 2020/0273978 A1 | 8/2020 | Ohno et al. |
| 2022/0045206 A1 | 2/2022 | Burke et al. |
| 2022/0216336 A1 | 7/2022 | Burke |

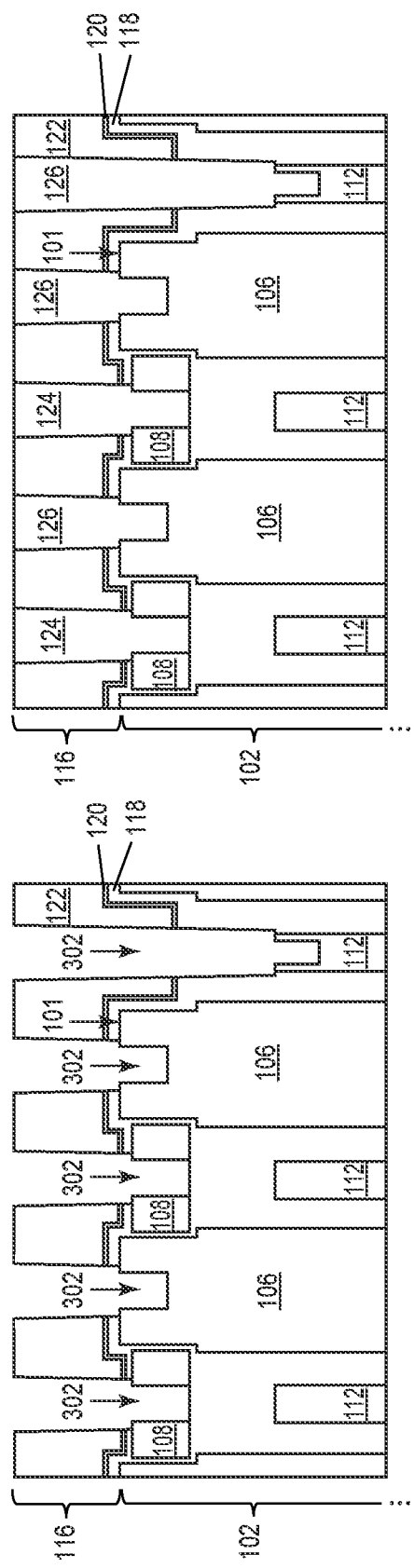

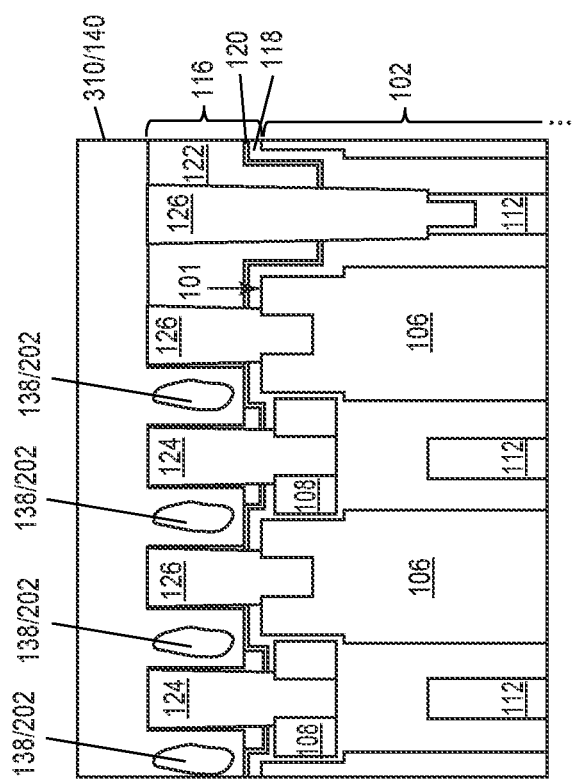
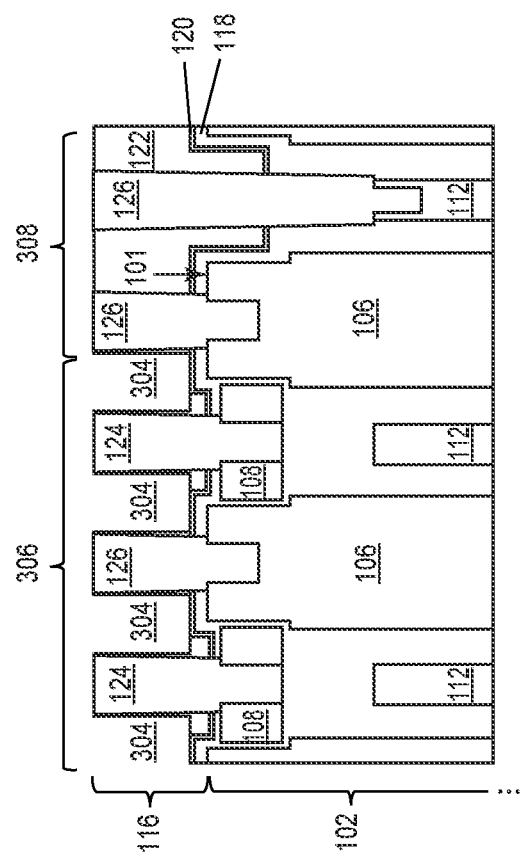
Figure 4F
Figure 4E

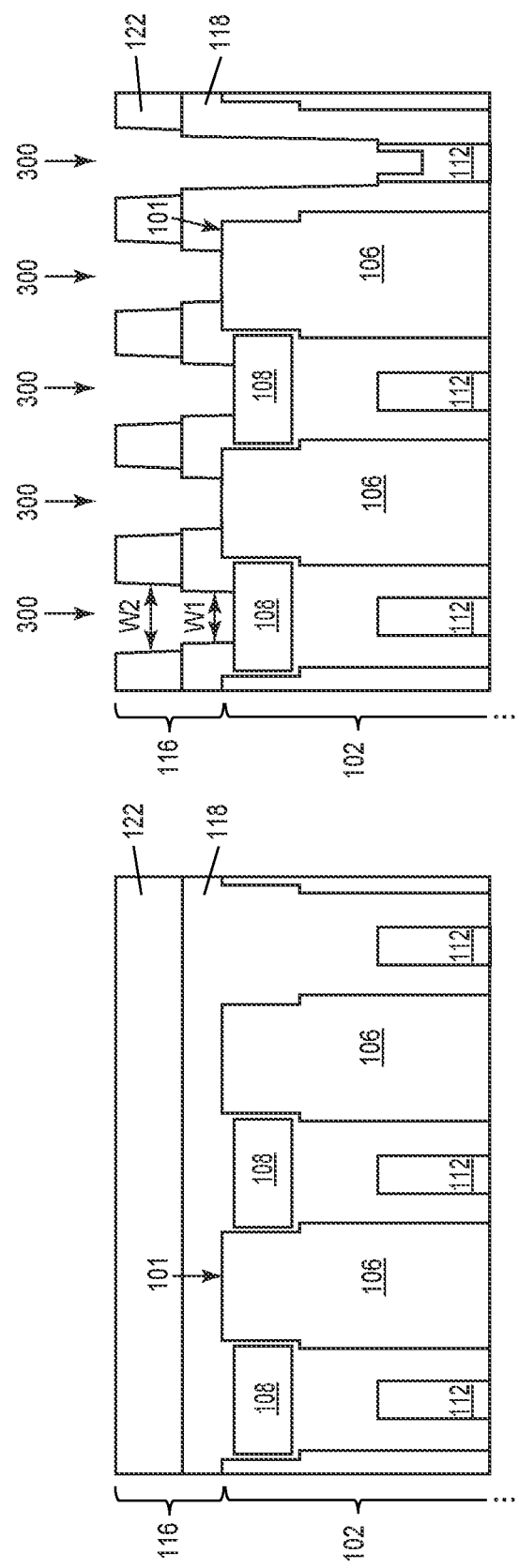

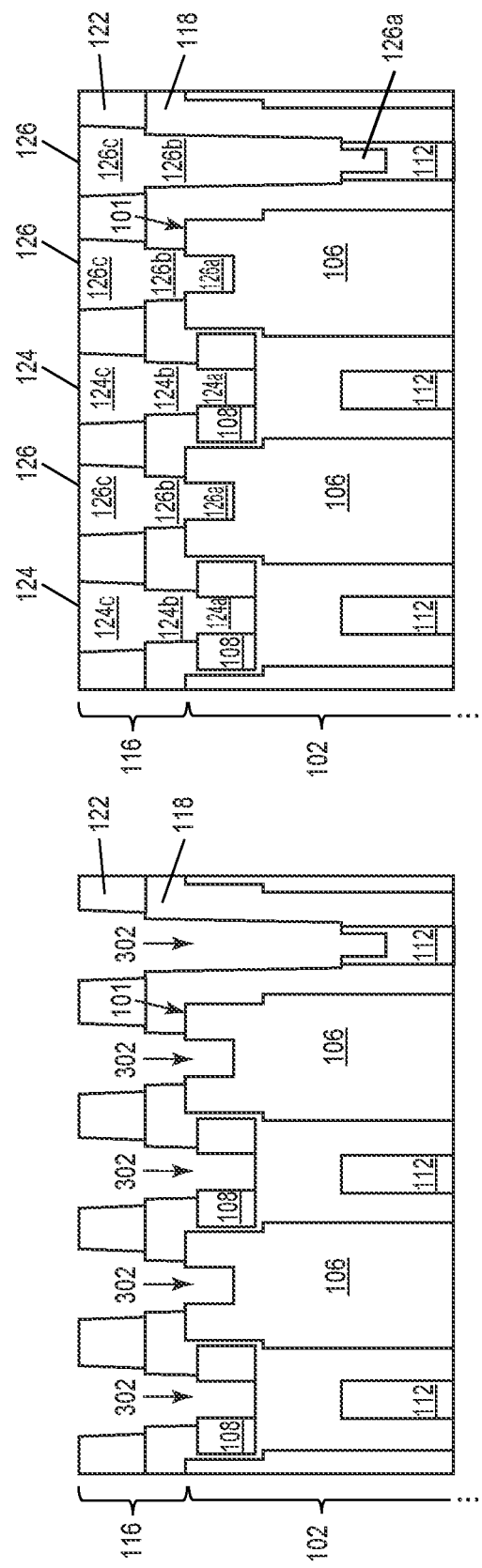

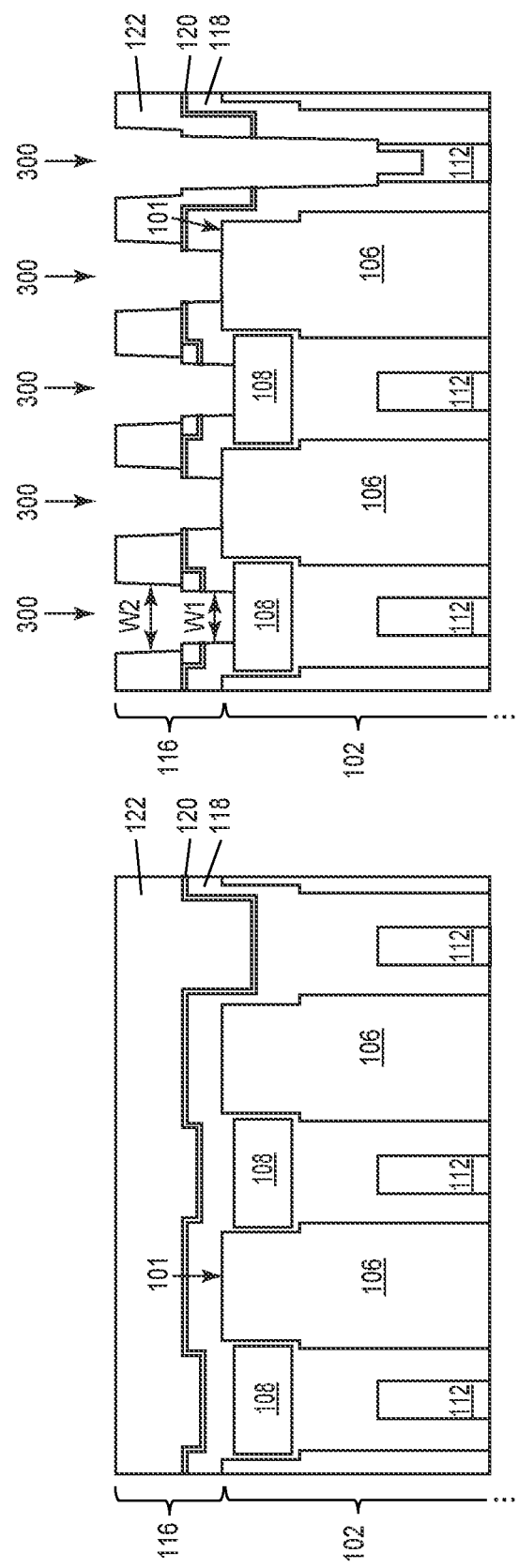

SEMICONDUCTOR DEVICE WITH SEMICONDUCTOR MESAS BETWEEN ADJACENT GATE TRENCHES

BACKGROUND

The integration of metal gates to reduce poly electrode resistance is a key consideration for next generation low and medium voltage (e.g., up to about 100V) power MOSFETs (metal-oxide-semiconductor field-effect transistors), allowing for uniform and fast switching in high frequency switching applications (e.g., in a range of 500 kHz to 1 MHZ or higher). The integration of low resistance materials such as metals and metal in combination with polysilicon results in an increase in electrode overlap, consequently increasing gate charges and capacitances. However, low gate charge and low gate resistance is important for achieving high performance. Hybrid gate structures allow for low complexity integration, while reducing gate resistance and keeping the polysilicon-to-gate oxide interface to define the threshold voltage without compromising subthreshold leakages and avalanche ruggedness of the device.

Hybrid gate structures are realized by recess concepts and the overlap of different metal electrodes is controlled by depth of the recess process. This requires constricted specifications for the variations of different dimensions and tight process control for the gate and body contacts. Furthermore, the realization of a hybrid gate structure using a recess concept requires a larger number of process steps of a higher complexity.

Thus, there is a need for an improved contact structure for low and medium voltage power MOSFETs and related methods of production.

SUMMARY

According to an embodiment of a semiconductor device, the semiconductor device comprises: a semiconductor substrate having a first main surface; a plurality of gate trenches extending from the first main surface into the semiconductor substrate; a semiconductor mesa between adjacent gate trenches; a first interlayer dielectric on the first main surface; a plurality of first metal contacts extending through the first interlayer dielectric and contacting gate electrodes disposed in the gate trenches; a plurality of second metal contacts extending through the first interlayer dielectric and contacting the semiconductor mesas; and an air gap or a dielectric material having a lower dielectric constant than the first interlayer dielectric between adjacent first and second metal contacts.

According to an embodiment of a method of producing a semiconductor device, the method comprises: forming a plurality of gate trenches extending from a first main surface of a semiconductor substrate into the semiconductor substrate such that a semiconductor mesa is arranged between adjacent gate trenches; forming a first interlayer dielectric on the first main surface; forming a plurality of first metal contacts extending through the first interlayer dielectric and contacting gate electrodes disposed in the gate trenches; forming a plurality of second metal contacts extending through the first interlayer dielectric and contacting the semiconductor mesas; and forming an air gap or a dielectric material having a lower dielectric constant than the first interlayer dielectric between adjacent first and second metal contacts.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 4A through 4F illustrate partial cross-sectional views during different stages of producing either the semiconductor device shown in FIG. 1 or the semiconductor device shown in FIG. 2, according to another embodiment.

FIGS. 5A through 5F illustrate partial cross-sectional views during different stages of producing either the semiconductor device shown in FIG. 1 or the semiconductor device shown in FIG. 2, according to another embodiment.

FIGS. 6A through 6F illustrate partial cross-sectional views during different stages of producing either the semiconductor device shown in FIG. 1 or the semiconductor device shown in FIG. 2, according to another embodiment.

DETAILED DESCRIPTION

The embodiments described provide an improved contact structure for power transistors and related methods of production. Trench gate electrodes are contacted by first metal contacts, and semiconductor mesas between the trench gates are contacted by second metal contacts. The improved contact structure includes an air gap or a low-k dielectric material between adjacent first and second metal contacts, yielding a hybrid gate structure with low gate charge due to a reduction in overlap capacitance of the metal contacts and low integration complexity. Simulations show that the gate charge resulting from the improved contact structure described herein can be just as low as in the case of conventional recess concepts, but with a simpler integration approach. Furthermore, considering both local and global recess depth variations associated with conventional recess concepts, the improved contact structure described herein is expected to achieve tighter control (less variation) of the gate charge. Accordingly, faster (e.g., in a range of 500 kHz to 1 MHZ or higher) and more uniform switching may be realized with higher efficiencies while keeping processing cost low.

Described next with reference to the figures are embodiments of the improved contact structure and corresponding methods of production.

Figure 1:
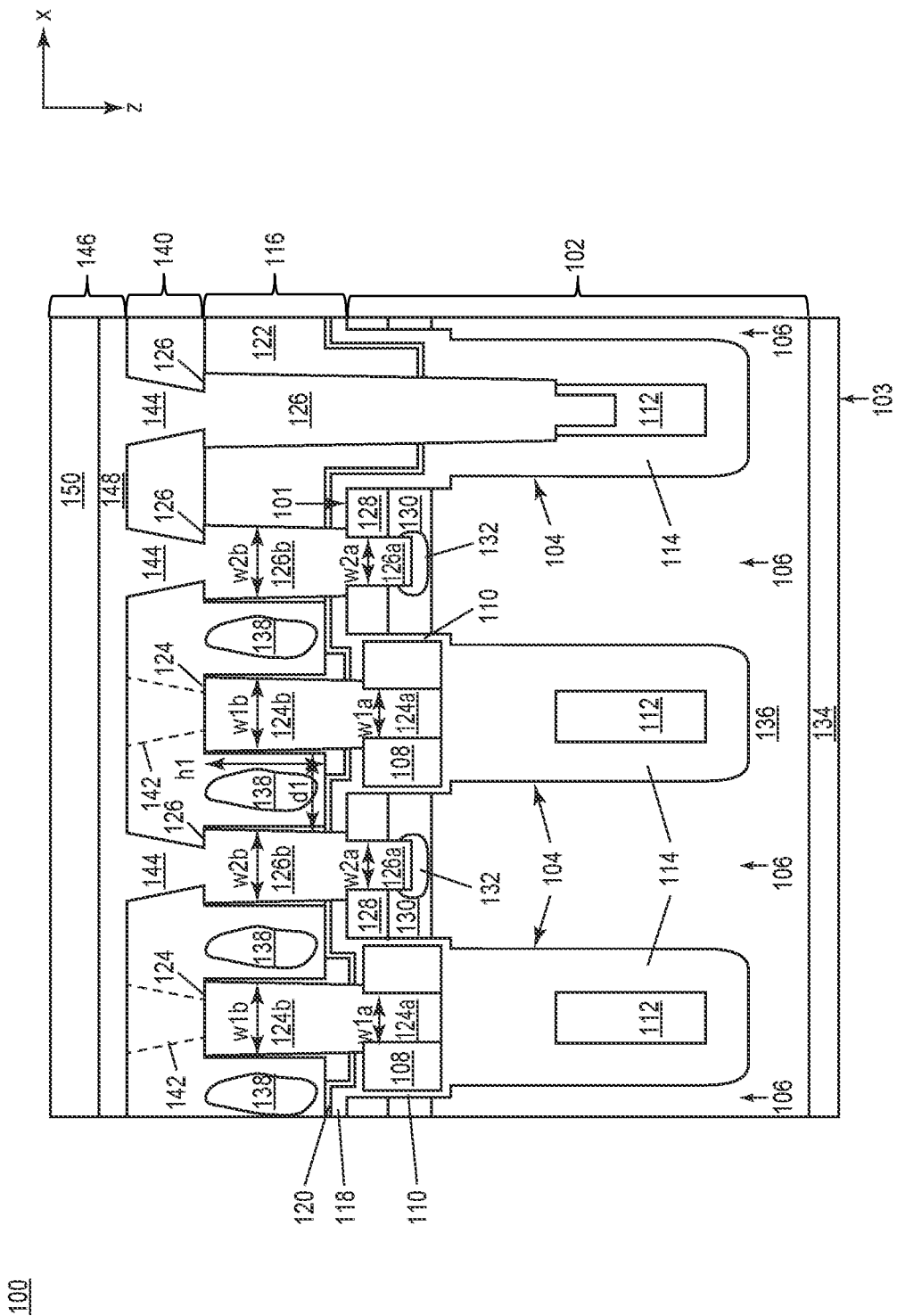
FIG. 1 illustrates a partial cross-sectional view of a semiconductor device having a contact structure with reduced overlap capacitance between adjacent metal contacts.

FIG. 1 illustrates a partial cross-sectional view of a semiconductor device 100 having a contact structure with reduced overlap capacitance between adjacent metal contacts. The semiconductor device 100 may be a low voltage power MOSFET device having a maximum voltage rating of 40V or below. The semiconductor device 100 instead may be a medium voltage power MOSFET having a maximum voltage rating between 40V and 100V. Other device types may utilize the contact teachings described herein, such as but not limited to IGBTs (insulated gate bipolar transistors), HEMTs (high-electron mobility transistors), etc.

The semiconductor device 100 includes a semiconductor substrate 102. The semiconductor device 100 is described in the context of Si (silicon) as the semiconductor material of the substrate 102. In general, the substrate 102 may comprise one or more semiconductor materials that are used to form semiconductor devices such as power MOSFETs, IGBTs, HEMTs, etc. For example, the substrate 102 may include Si, silicon carbide (SiC), germanium (Ge), silicon germanium (SiGe), gallium nitride (GaN), gallium arsenide (GaAs), and the like. The semiconductor substrate 102 may be a bulk semiconductor material or may include one or more epitaxial layers grown on a bulk semiconductor material.

The semiconductor device 100 further includes gate trenches 104 extending from a first main surface 101 of the semiconductor substrate 102 and into the substrate 102, and semiconductor mesas 106 between adjacent gate trenches 104. The gate trenches 104 may be 'stripe-shaped' in that the gate trenches 104 have a longest linear dimension in a direction that runs in and out of the page in FIG. 1 and transverses the depth-wise direction (z direction in FIG. 1) of the semiconductor substrate 102.

A gate electrode 108 is disposed in each gate trench 104 and separated from the surrounding semiconductor substrate 102 by a gate dielectric 110. A field plate 112 may be disposed in the gate trenches 104 below the gate electrodes 108 and insulated from the surrounding semiconductor substrate 102 and the gate electrodes 108 by a field dielectric 114. The field plates 112 instead may be disposed in different trenches (not shown) than the gate electrodes 108. For example, the field plates 112 may be disposed in needle-shaped trenches that are separate from the gate trenches 104, the field plate trenches being narrow and long in a depth-wise direction (z direction in FIG. 1) of the semiconductor substrate 102. Such needle-shaped field plate trenches may resemble a needle, column or spicule in the depth-wise direction of the Semiconductor substrate 102.

The gate electrodes 108 and the field plates 112 may be made from any suitable electrically conductive material such as but not limited to polysilicon, metal (e.g., tungsten), metal alloy, etc. The gate electrodes 108 and the field plates 112 may comprise the same or different electrically conductive material. The gate dielectric 110 and the field dielectric 114 and may comprise the same or different electrically insulative material, e.g., SiOx and may be formed by one or more common processes such as but not limited to thermal oxidation and/or deposition.

A first interlayer dielectric 116 is disposed on the first main surface 101 of the semiconductor substrate 102. The first interlayer dielectric 116 may comprise one or more electrically insulating materials such as but not limited to SiOx, SiN, etc. The first interlayer dielectric 116 may include one or more layers, e.g., a stack of one or more layers of SiOx and one or more layers of SiN. In one embodiment, the first interlayer dielectric 116 includes a first oxide 118 layer in contact with the first main surface 101 of the semiconductor substrate 102, a silicon nitride layer 120 on the first oxide layer 118, and a second oxide layer 122 on the silicon nitride layer 118. The second oxide layer 122 may be thicker than the first oxide layer 118.

The semiconductor device 100 also includes first metal contacts 124 extending through the first interlayer dielectric 116 and contacting the gate electrodes 108 disposed in the gate trenches 104. Second metal contacts 126 similarly extend through the first interlayer dielectric 116 and contact the semiconductor mesas 106 delimited by the gate trenches 104. The first metal contacts 124 may terminate at the top surface of the gate electrodes 108, or instead may extend into or even completely through the gate electrodes 108 as shown in FIG. 1. The second metal contacts 126 may similarly terminate at the top surface of the semiconductor mesas 106, or instead may extend into the semiconductor mesas 106 also as shown in FIG. 1.

The first and second metal contacts 124, 126 may be made from any suitable metal or metal alloy. In one embodiment, the first metal contacts 124 comprise tungsten (W), the second metal contacts 126 comprise tungsten, and the gate electrodes 108 comprise polysilicon. In another embodiment, the first metal contacts 124, the second metal contacts 126, and the gate electrodes 108 each comprise tungsten. The first and second metal contacts 124, 126 may include a metal liner such as titanium (Ti) or titanium nitride (TiN) on which the tungsten is deposited.

The semiconductor mesas 106 contacted by the second metal contacts 126 may include a source region 128 of a first conductivity type and a body region 130 of a second conductivity type opposite the first conductivity type. The body regions 130 may include a body contact region 132 of the second conductivity type and having a higher doping concentration than the body regions 130, to provide an ohmic connection with the second metal contacts 126. The first conductivity is n-type and the second conductivity type is p-type for an n-channel device whereas the first conductivity is p-type and the second conductivity type is n-type for a p-channel device. For either n-channel or p-channel devices, the source region 128 and the body region 130 included in the same semiconductor mesa 106 may form part of a transistor cell, and the transistor cells may be electrically connected in parallel to form a power transistor.

In the case of a vertical power transistor as shown in FIG. 1, the primary current flow path is between the first main surface 101 of the semiconductor substrate 102 and a second main surface 103 of the semiconductor substrate 102 opposite the first main surface 101. In this case, a drain region 134 of the first conductivity type is located at the second main surface 103 of the semiconductor substrate 102 and a drift region 136 of the first conductivity type is positioned between the drain region 134 and the body regions 130. In the case of a lateral power transistor, the primary current flow path is along the first main surface 101 of the semiconductor substrate 102 and the drain region 134 is positioned at the first main surface 101 and spaced apart from the source regions 128 by the drift region 136 at the first main surface 101.

Regardless of the type of power transistor implemented by the transistor cells, and according to the embodiment illustrated in FIG. 1, the semiconductor device 100 further includes an air gap 138 between adjacent first and second metal contacts 124, 126. The air gaps 138 are formed in the first interlayer dielectric 116, above the first main surface 101 of the semiconductor substrate 102. The distance d1 between the adjacent first and second metal contacts 124, 126 occupied by the air gaps 138 may be less than or equal to 200 nm, for example.

The air gaps 138 reduce the overlap capacitance between the adjacent first and second metal contacts 124, 126, yielding a hybrid gate structure with relatively low gate charge. For example, the gate charge may be reduced by about 15% by including the air gaps 138. In other words, the same device but without the air gaps 138 would have an approximately 15% higher gate charge. Such a reduction in gate charge enables the semiconductor device 100 to implement fast switching in high frequency switching applications (e.g., in a range of 500 kHz to 1 MHZ or higher).

The air gaps 138 may be present between each pair of adjacent first and second metal contacts 124, 126. Alternatively, the air gaps 138 may be present between some adjacent first and second metal contacts 124, 126 but not between other adjacent first and second metal contacts 124, 126. For example, the air gaps 138 may be present between adjacent first and second metal contacts 124, 126 in one part of the semiconductor device 100 but not in another part. In one embodiment, the rightmost part of FIG. 1 illustrates a region of the semiconductor device 100 that does not include the air gaps 138. This region may be a source field plate contact region, where the gate electrode 108 is omitted from the corresponding trench 104 to allow for contacting of the buried field plate 112. The first interlayer dielectric 116 may have a different structure, configuration and/or composition in this part of the device 100, as indicated in FIG. 1. For example, the second oxide layer 122 may remain fully intact in the source field plate contact region since the air gaps 138 are not formed in this region. In the region with the air gaps 138, most or all of the second oxide layer 122 has been removed and the material of a second interlayer dielectric 140 may fill the spaces between the adjacent first and second contacts 124, 126 to define the air gaps 138. The air gaps 138 may be omitted from the edge termination region of the semiconductor device 100, which is not shown in FIG. 1. The air gaps 138 may be omitted from still other parts of the semiconductor device 100, such as gate finger regions where the gate electrodes 108 are contacted.

The second interlayer dielectric 140 disposed on the first interlayer dielectric 116 may comprise one or more electrically insulating materials such as but not limited to SiOx, SiN, etc. The second interlayer dielectric 140 may include one or more layers, e.g., a stack of one or more layers of SiOx and one or more layers of SiN.

Third metal contacts 142 extend through the second interlayer dielectric 140 and contact the first metal contacts 124. The third metal contacts 142 are shown as dashed trapezoids in FIG. 1, since the third metal contacts 142 are disposed in a plane that is out of view in FIG. 1. Fourth metal contacts 144 similarly extend through the second interlayer dielectric 140 and contact the second metal contacts 126. The material of the second interlayer dielectric 140 seals the air gap 138 between adjacent first and second metal contacts 124, 126.

A structured metallization 146 on the second interlayer dielectric 140 provides connection routing to the gate electrodes 108 via the first and third contacts 124, 142, and separate connection routing to the semiconductor mesas 106 via the second and fourth contacts 126, 144. The structured metallization 146 may include one or more layers of metal or metal alloy. In one embodiment, the structured metallization 146 may include a first layer 148 of the same material as the third and fourth contacts 142, 144 and a second layer 150 of a different material. For example, the first layer 148 and the third and fourth contacts 142, 144 may comprise tungsten (W) and a metal liner such as Ti or TiN, and the second layer 150 may comprise Al, Cu, AlCu, etc.

Figure 2:
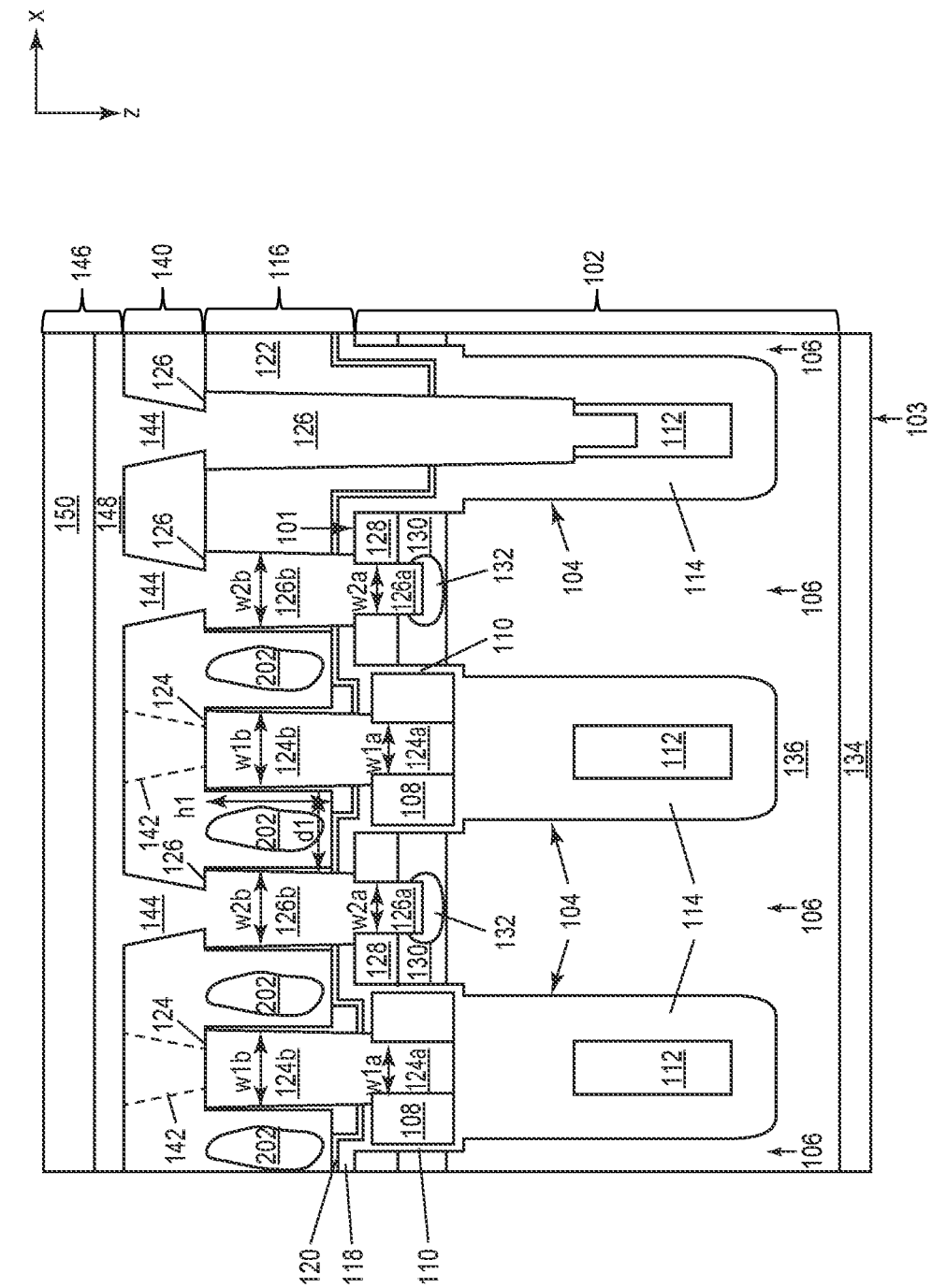
FIG. 2 illustrates a partial cross-sectional view of a semiconductor device having a contact structure with reduced overlap capacitance between adjacent metal contacts, according to another embodiment.

FIG. 2 illustrates a partial cross-sectional view of another embodiment of a semiconductor device 200 having a contact structure with reduced overlap capacitance between adjacent metal contacts. The embodiment shown in FIG. 2 is similar to the embodiment shown in FIG. 1. Different, however, the air gaps 138 between adjacent first and second metal contacts 124, 126 are replaced by a (low-k) dielectric material 202 having a lower dielectric constant than the first interlayer dielectric 116, e.g., the low-k dielectric material 202 may be silsesquioxane, xerogel, etc. Similar to the air gap embodiment, the low-k dielectric material 202 may be present between all adjacent first and second metal contacts 124, 126 or between some adjacent first and second metal contacts 124, 126 but not between other adjacent first and second metal contacts 124, 126. The embodiments described above for the semiconductor device 100 shown in FIG. 1 may be applied to the semiconductor device 200 shown in FIG. 2, except that the air gaps 138 are replaced by the low-k dielectric material 202. Additional embodiments are described next which may be applied to just the semiconductor device 100 shown in FIG. 1, to just the semiconductor device 200 shown in FIG. 2, or to both devices 100, 200.

The first metal contacts 124 may have a first part 124a in the gate electrodes 108 and a second part 124b in the first interlayer dielectric 116. The second part 124b of the first metal contacts 124 may be wider (w1b>w1a) than the first part 124a of the first metal contacts 124. Similarly, the second metal contacts 126 may have a first part 126a in the semiconductor mesas 106 and a second part 126b in the first interlayer dielectric 116. The second part 126b of the second metal contacts 126 may be wider (w2b>w2a) than the first part 126a of the second metal contacts 126. The air gaps 138 or alternatively the low-k dielectric material 202 may be disposed in the first interlayer dielectric 116 between the second part 124b, 126b of adjacent first and second metal contacts 124, 126.

Separately or in combination, the air gaps 138 or alternatively the low-k dielectric material 202 may have a negative taper relative to the semiconductor substrate 102 such that the air gaps 138 or alternatively the low-k dielectric material 202 are wider closer to the semiconductor substrate 102 and narrower further from the semiconductor substrate 102, which optimally reduces the overlap capacitance between adjacent metal contacts 124, 126 in close proximation to the transistor cells.

Separately or in combination, the space between adjacent first and second metal contacts 124, 126 may have an aspect ratio of at least 3:1 where the aspect ratio relates vertical height 'h1' of the space to the lateral width 'd1' of the space between the adjacent first and second metal contacts 124, 126.

FIGS. 3A through 3F illustrate partial cross-sectional views during different stages of producing either the semiconductor device 100 shown in FIG. 1 or the semiconductor device 200 shown in FIG. 2.

Figure 3B:
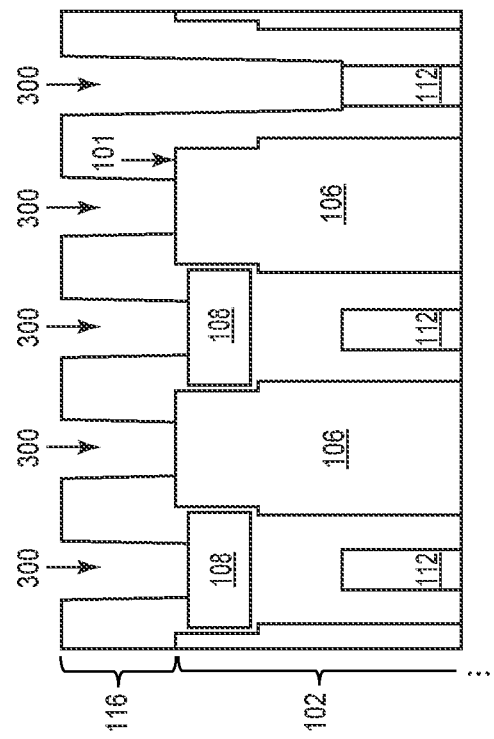
FIGS. 3A through 3F illustrate partial cross-sectional views during different stages of producing either the semiconductor device shown in FIG. 1 or the semiconductor device shown in FIG. 2.
Figure 3A:
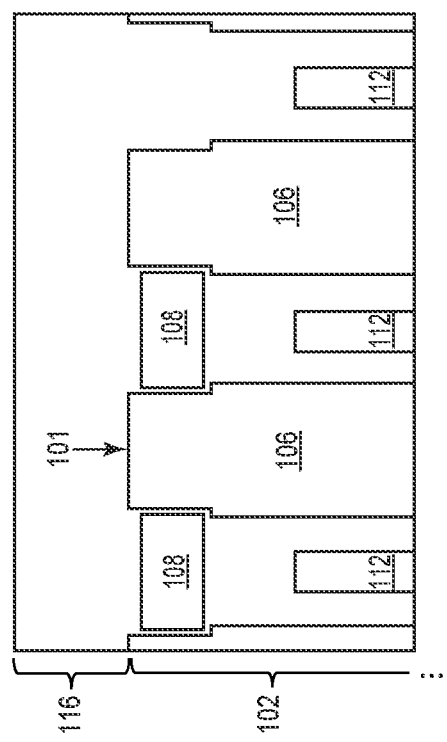

FIG. 3A shows the semiconductor substrate 102 after the gate trenches 104 are formed in the semiconductor substrate 102 and after the first interlayer dielectric 116 is formed on the first main surface 101 of the semiconductor substrate 102. The device regions formed in the semiconductor substrate 102 are not shown so as to not unnecessarily complicate FIGS. 3A through 3F. The first interlayer dielectric 116 may comprise undoped silicate glass (USG) formed by a high-density plasma (HDP) deposition process, for example.

FIG. 3B shows the semiconductor substrate 102 after first contact openings 300 are formed in the first interlayer dielectric 116 to expose the gate electrodes 108 and the semiconductor mesas 106, respectively. Standard lithography and dielectric etching processes may be used to form the first contact openings 300 in the first interlayer dielectric 116.

Figure 3D:
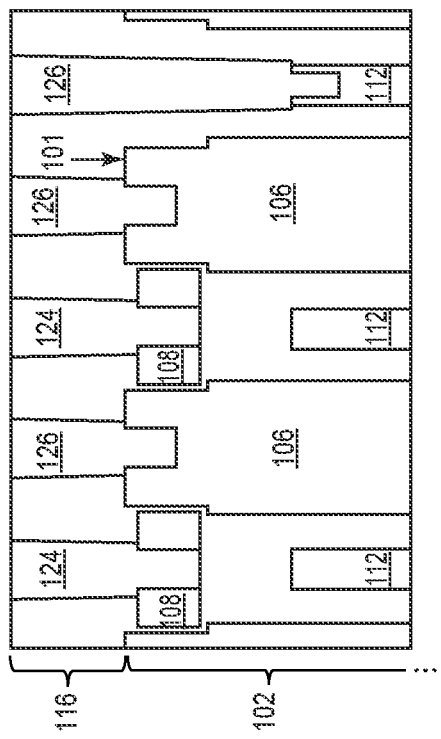
Figure 3C:
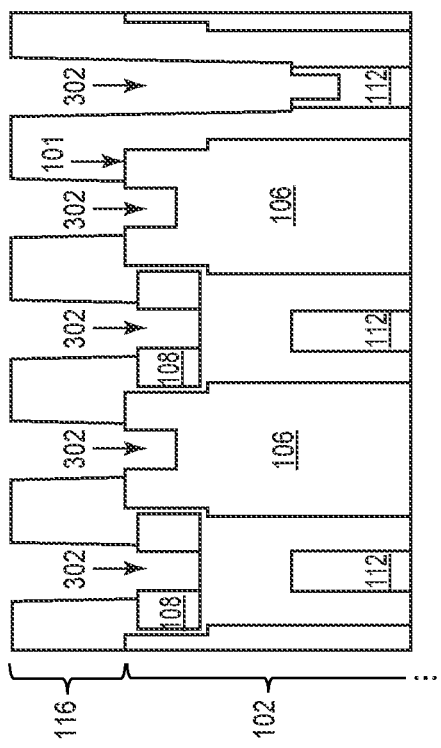

FIG. 3C shows the semiconductor substrate 102 after second contact openings 302 are formed in the gate electrodes 108, semiconductor mesas 106 and optionally the field plates 112 in a source field plate contact region or other region where the air gaps 138 are not to be formed. Standard metal/semiconductor etching processes may be used to form the second contact openings 302. The body contact regions 132 may be formed by implanting a dopant species of the second conductivity type into the semiconductor mesas 106 through the corresponding second contact openings 302 etched into the semiconductor mesas 106.

FIG. 3D shows the semiconductor substrate 102 after the first and second contact openings 300, 302 are filled with a metal or metal alloy and planarized to form the first and second contacts 124, 126. Any standard metal deposition process may be used to form the first and second contacts 124, 126. For example, a Ti/TiN liner may be deposited to line the sidewalls and bottom of the first and contact openings 300, 302, followed by a tungsten deposition that fills the first and second contact openings 300, 302. The tungsten may be planarized, e.g., by CMP (chemical-mechanical polishing).

Figure 3F:
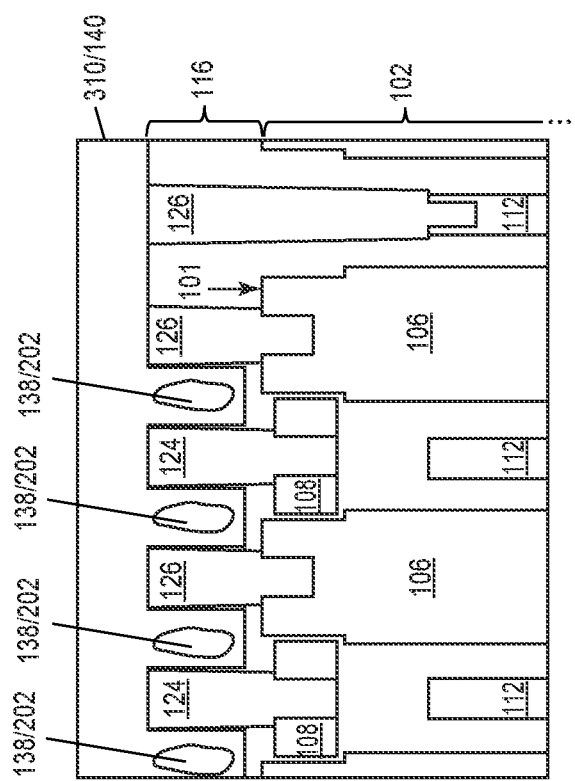
Figure 3E:
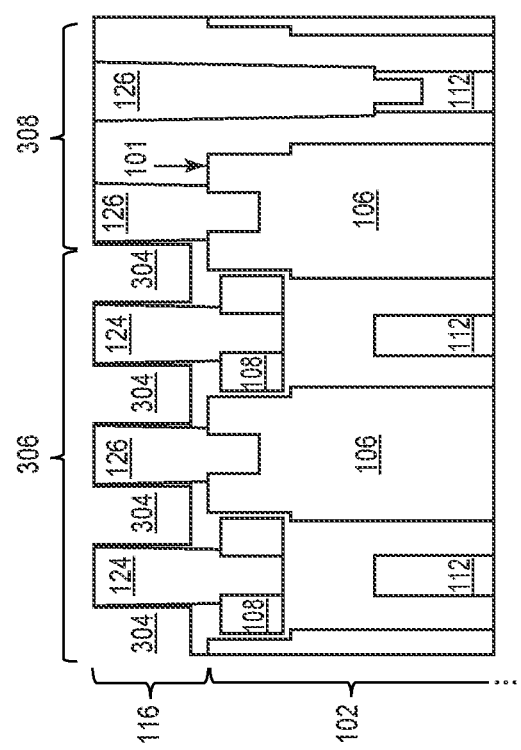

FIG. 3E shows the semiconductor substrate 102 after etching the first interlayer dielectric 116 to form open spaces 304 between adjacent first and second metal contacts 124, 126. Standard lithography and dielectric etching processes may be used to etch the spaces 304 into the first interlayer dielectric 116 between adjacent first and second metal contacts 124,126. The first interlayer dielectric 116 may be etched in a first region 306 and protected from the etching in a second region 308 such as a source field plate contact region, an edge termination region, gate finger region, etc., such that the spaces 304 are present in the first region 306 but not in the second region 308. In one embodiment, the etching is implemented as a timed etching process that stops after a predetermined amount of time lapses.

FIG. 3F shows the semiconductor substrate 102 after depositing an oxide 310 using, e.g., a chemical vapor deposition (CVD) process, by sputtering $SiO_2$, etc. The spaces 304 between adjacent first and second metal contacts 124, 126 may have an aspect ratio of at least 3:1, as previously described herein. With such a high aspect ratio, the oxide 310 seals the spaces 304 to from the air gaps 138 between adjacent first and second metal contacts 124, 126. The CVD process may be continued after the oxide 310 seals the spaces 304, to form the second interlayer dielectric 140 on the first interlayer dielectric 116. The third and fourth contacts 142, 144 may then be formed in the second interlayer dielectric 140, and the structured metallization 146 formed on the second interlayer dielectric 140. For example, the oxide 310 may be planarized, e.g., by CMP, openings may be formed in the planarized oxide 310, the openings may be filled with one or more metals and/or metal alloys such as Ti/TiN and/or W to form the third and fourth metal contacts 142, 144 and the first layer 148 of structured metallization 146, and different a metal or metal alloy may be deposited on the first layer 148 to form the second layer 150 of the structured metallization 146. Instead of sealing the spaces 304 in the first interlayer dielectric 116, the spaces 304 may be filled with a (low-k) dielectric material 202 having a lower dielectric constant than the first interlayer dielectric 116.

FIGS. 4A through 4F illustrate partial cross-sectional views during different stages of producing either the semiconductor device 100 shown in FIG. 1 or the semiconductor device 200 shown in FIG. 2, according to another embodiment. The stages shown in FIGS. 4A through 4F correspond to the same stages shown in FIGS. 3A through 3F, respectively. Accordingly, the same process description provided above for FIGS. 3A through 3F may be applied to yield the stages shown in FIG. 4A through 4F, respectively, and are not reproduced here in the interest of brevity.

Figures 4A, 4B:
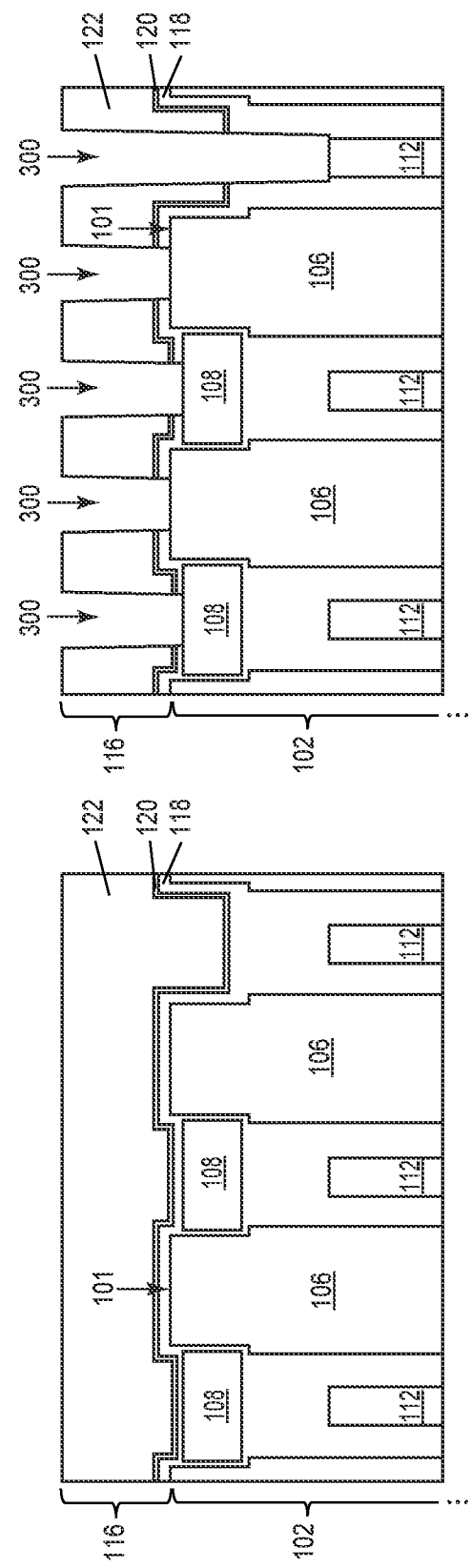

Different than the embodiment illustrated in FIGS. 3A through 3F, the embodiment illustrated in FIGS. 4A through 4F utilizes an etch stop layer instead of a timed etch for controlling the etching of the first interlayer dielectric 116 to form the spaces 304 between adjacent first and second metal contacts 124,126. In one embodiment, the first interlayer dielectric 116 includes a first oxide layer 118 in contact with the first main surface 101 of the semiconductor substrate 102, a silicon nitride layer 120 on the first oxide layer 118, and a second oxide layer 122 on the silicon nitride layer 120. The second oxide layer 122 may be thicker than the first oxide layer 118, as previously explained herein. The silicon nitride layer 120 may be formed during an oxide deposition process such that the silicon nitride layer 120 is interposed between the first and second oxide layers 118, 122. The etching of the first interlayer dielectric 116 stops when the silicon nitride layer 120 is detected, as illustrated in FIG. 4E. That is, when the second oxide layer 122 is completely etched through, the silicon nitride layer 120 becomes exposed. The etching of first interlayer dielectric 116 stops when the exposed part of the silicon nitride layer 120 is detected, e.g., using a standard end-point detection technique.

FIGS. 5A through 5F illustrate partial cross-sectional views during different stages of producing either the semiconductor device 100 shown in FIG. 1 or the semiconductor device 200 shown in FIG. 2, according to another embodiment. The stages shown in FIGS. 5A through 5F correspond to the same stages shown in FIGS. 3A through 3F, respectively. Accordingly, the same process description provided above for FIGS. 3A through 3F may be applied to yield the stages shown in FIG. 5A through 5F, respectively, and are not reproduced here in the interest of brevity.

Figure 5F:
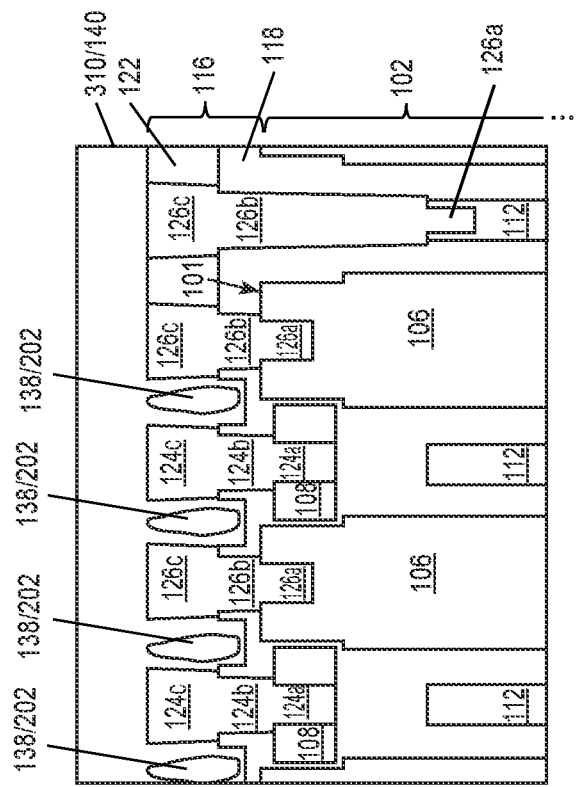
Figure 5E:
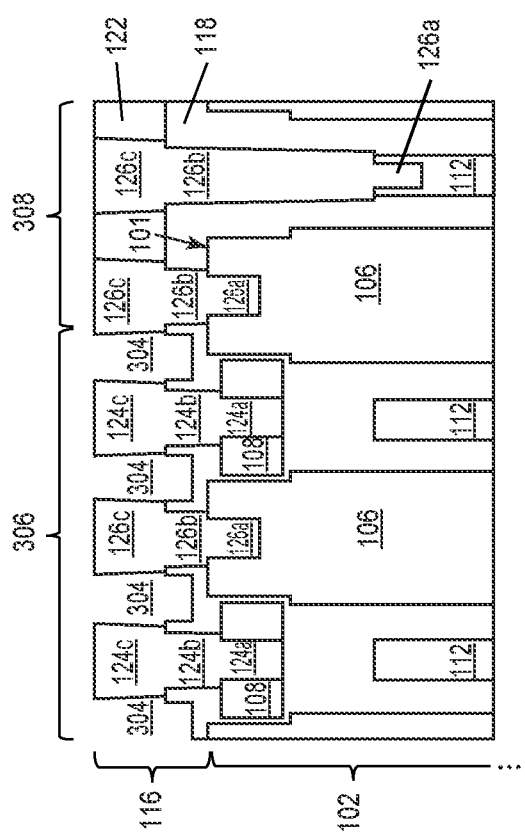

Different than the embodiment illustrated in FIGS. 3A through 3F, the first interlayer dielectric 116 in FIGS. 5A through 5F comprises first and second oxide layers 118, 122 of different insulating materials having different etching properties. Accordingly, the first contact openings 300 formed in the first interlayer dielectric 116 and that expose the gate electrodes 108 and the field plates 112 have a different width (W1≠W2) in the first oxide layer 118 compared to the second oxide layer 122, as shown in FIG. 5B. For example, the first oxide layer 118 may comprise USG and the second oxide layer 122 may comprise borophosphosilicate glass (BPSG). In this case, the part of the first contact openings 300 formed in the second oxide layer 122 may be wider (W2>W1) than the part of the first contact openings 300 formed in the first oxide layer 118.

Due to the width difference of the first contact openings 300 formed in the first interlayer dielectric 116, the first metal contacts 124 also have a third part 124c above the second part 124b and that is wider than the second part 124b. The second metal contacts 126 similarly have a third part 126c above the second part 126b and that is wider than the second part 126b. The air gaps 138 or alternatively low-k dielectric material 202 are disposed in the spaces 304 between both the second part 124b, 126b and the third part 124c, 126c of adjacent first and second metal contacts 124, 126, as shown in FIG. 5F.

FIGS. 6A through 6F illustrate partial cross-sectional views during different stages of producing either the semiconductor device 100 shown in FIG. 1 or the semiconductor device 200 shown in FIG. 2, according to another embodiment. The stages shown in FIGS. 6A through 6F correspond to the same stages shown in FIGS. 5A through 5F, respectively. Accordingly, the same process description provided above for FIGS. 5A through 5F may be applied to yield the stages shown in FIG. 6A through 6F, respectively, and are not reproduced here in the interest of brevity.

Figures 6C, 6D:
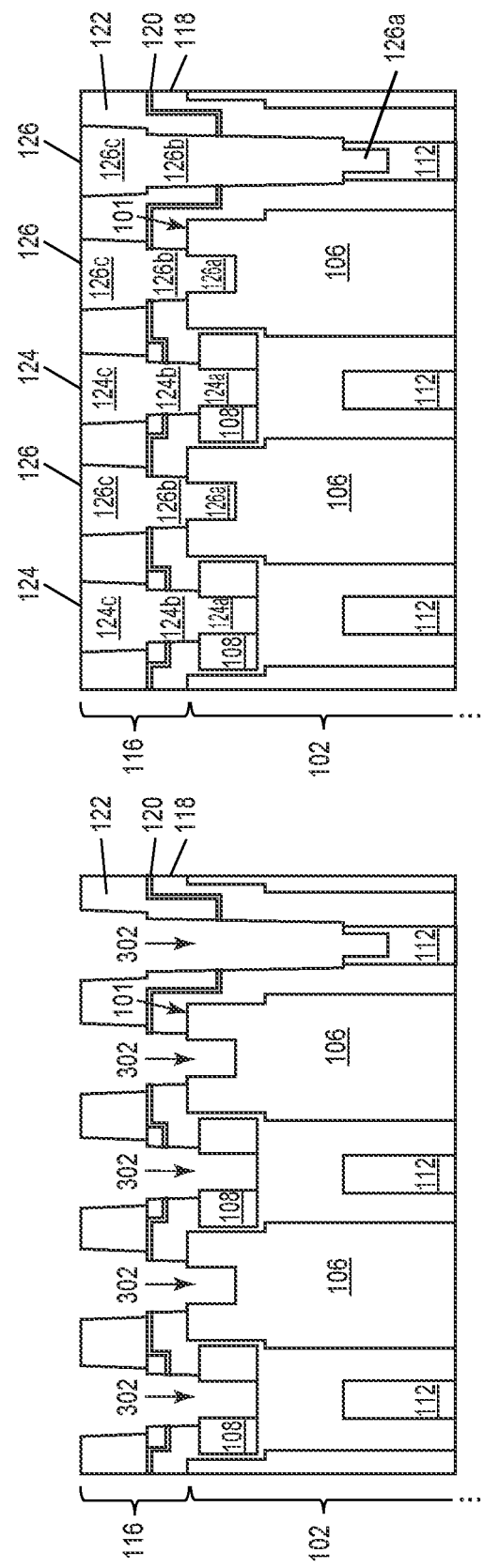
Figure 6F:
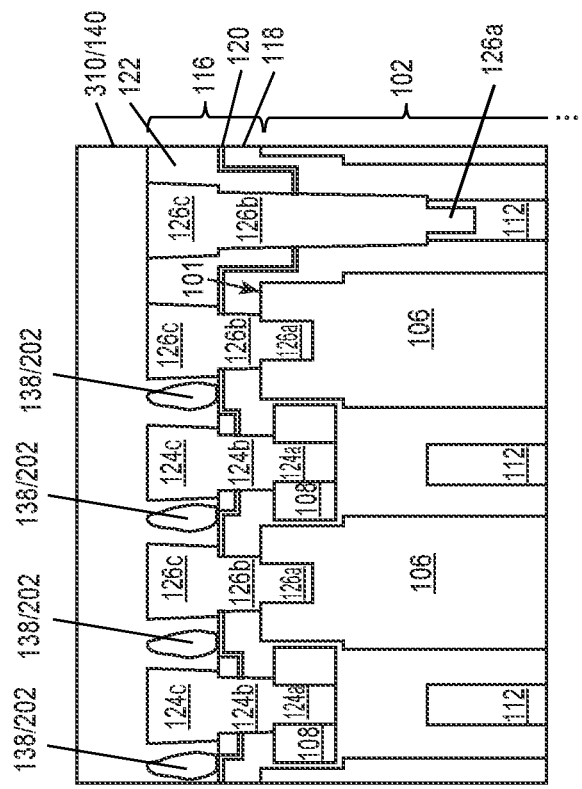
Figure 6E:
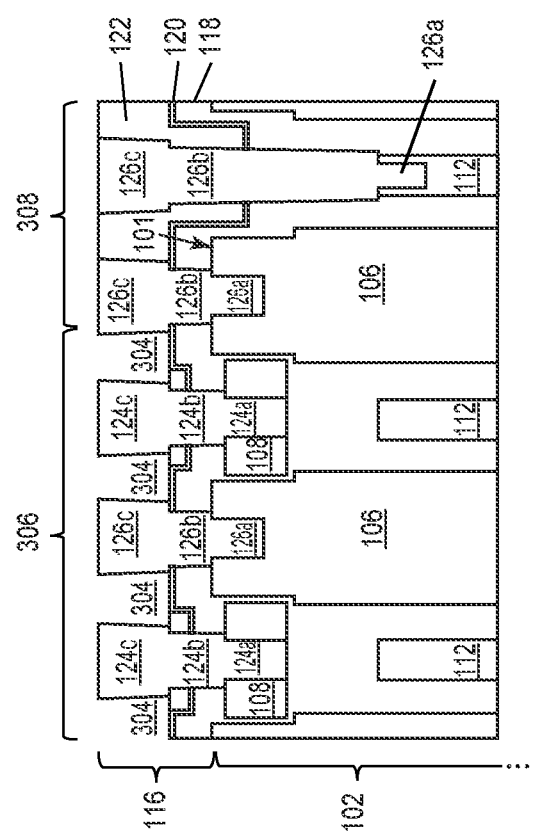

Different than the embodiment illustrated in FIGS. 5A through 5F, the embodiment illustrated in FIGS. 6A through 6F utilizes an etch stop layer instead of a timed etch for controlling the etching of the air gaps 138 into the first interlayer dielectric 116 between adjacent first and second metal contacts 124,126. In one embodiment, the first interlayer dielectric 116 includes a first oxide layer 118 in contact with the first main surface 101 of the semiconductor substrate 102, a silicon nitride layer 120 on the first oxide layer 118, and a second oxide layer 122 on the silicon nitride layer 120. The second oxide layer 122 may be thicker than the first oxide layer 118, as previously explained herein. The etching of the first interlayer dielectric 116 stops when the silicon nitride layer 120 is detected, as illustrated in FIG. 6E. That is, when the second oxide layer 122 is completely etched through, the silicon nitride layer 120 becomes exposed. The etching of first interlayer dielectric 116 stops when the exposed part of the silicon nitride layer 120 is detected, e.g., using a standard end-point detection technique.

Although the present disclosure is not so limited, the following numbered examples demonstrate one or more aspects of the disclosure.

Example 1. A semiconductor device, comprising: a Si substrate having a first main surface; a plurality of gate trenches extending from the first main surface into the Si substrate; a semiconductor mesa between adjacent gate trenches; a first interlayer dielectric on the first main surface; a plurality of first metal contacts extending through the first interlayer dielectric and contacting gate electrodes disposed in the gate trenches; a plurality of second metal contacts extending through the first interlayer dielectric and contacting the semiconductor mesas; and an air gap or a dielectric material having a lower dielectric constant than the first interlayer dielectric between adjacent first and second metal contacts.

Example 2. The semiconductor device of example 1, wherein the air gap is between adjacent first and second metal contacts.

Example 3. The semiconductor device of example 2, wherein the distance between adjacent first and second metal contacts occupied by the air gap is less than or equal to 200 nm.

Example 4. The semiconductor device of any of examples 1 through 3, wherein the first metal contacts extend into the gate electrodes and have a first part in the gate electrodes and a second part in the first interlayer dielectric and that is wider than the first part, wherein the second metal contacts extend into the semiconductor mesas and have a first part in the semiconductor mesas and a second part in the first interlayer dielectric and that is wider than the first part, and wherein the air gap or the dielectric material having the lower dielectric constant is between the second part of adjacent first and second metal contacts.

Example 5. The semiconductor device of example 4, wherein the first metal contacts further have a third part above the second part and that is wider than the second part, wherein the second metal contacts further have a third part above the second part and that is wider than the second part, and wherein the air gap or the dielectric material having the lower dielectric constant is between both the second part and the third part of adjacent first and second metal contacts.

Example 6. The semiconductor device of any of examples 1 through 5, wherein the air gap or the dielectric material having the lower dielectric constant has a negative taper relative to the Si substrate such that the air gap or the dielectric material having the lower dielectric constant is wider closer to the Si substrate and narrower further from the Si substrate.

Example 7. The semiconductor device of any of examples 1 through 6, wherein a space between adjacent first and second metal contacts has an aspect ratio of at least 3:1 where the aspect ratio relates vertical height of the space to lateral width of the space between the adjacent first and second metal contacts.

Example 8. The semiconductor device of any of examples 1 through 7, wherein the first interlayer dielectric comprises a first oxide layer in contact with the first main surface of the Si substrate, a silicon nitride layer on the first oxide layer, and a second oxide layer on the silicon nitride layer, and wherein the second oxide layer is thicker than the first oxide layer.

Example 9. The semiconductor device of any of examples 1 through 8, wherein the first metal contacts comprise tungsten, wherein the second metal contacts comprise tungsten, and wherein the gate electrodes comprise polysilicon.

Example 10. The semiconductor device of any of examples 1 through 8, wherein the first metal contacts, the second metal contacts, and the gate electrodes each comprise tungsten.

Example 11. The semiconductor device of any of examples 1 through 10, wherein each semiconductor mesa includes a source region of a first conductivity type and a body region of a second conductivity type, wherein the source region and the body region included in the same semiconductor mesa form part of a transistor cell, and wherein the transistor cells are electrically connected in parallel to form a transistor.

Example 12. The semiconductor device of any of examples 1 through 11, further comprising a plurality of field plates below and insulated from the gate electrodes in the gate trenches, or in field plate trenches that are separate from the gate trenches.

Example 13. The semiconductor device of any of examples 1 through 12, further comprising: a second interlayer dielectric on the first interlayer dielectric; a plurality of third metal contacts extending through the second interlayer dielectric and contacting the first metal contacts; and a plurality of fourth metal contacts extending through the second interlayer dielectric and contacting the second metal contacts, wherein a material of the second interlayer dielectric seals the air gap between adjacent first and second metal contacts.

Example 14. A method of producing a semiconductor device, the method comprising: forming a plurality of gate trenches extending from a first main surface of a Si substrate into the Si substrate such that a semiconductor mesa is arranged between adjacent gate trenches; forming a first interlayer dielectric on the first main surface; forming a plurality of first metal contacts extending through the first interlayer dielectric and contacting gate electrodes disposed in the gate trenches; forming a plurality of second metal contacts extending through the first interlayer dielectric and contacting the semiconductor mesas; and forming an air gap or a dielectric material having a lower dielectric constant than the first interlayer dielectric between adjacent first and second metal contacts.

Example 15. The method of example 14, wherein forming the air gap comprises: etching the first interlayer dielectric between adjacent first and second metal contacts; and after the etching, depositing an oxide using a chemical vapor deposition process or by sputtering, wherein the oxide seals the air gap between adjacent first and second metal contacts.

Example 16. The method of example 15, further comprising: continuing the chemical vapor deposition process or the sputtering after the oxide seals the air gap between adjacent first and second metal contacts, to form a second interlayer dielectric on the first interlayer dielectric.

Example 17. The method of example 16, further comprising: forming a plurality of third metal contacts extending through the second interlayer dielectric and contacting the first metal contacts; and forming a plurality of fourth metal contacts extending through the second interlayer dielectric and contacting the second metal contacts.

Example 18. The method of any of examples 14 through 17, wherein the etching is implemented as a timed etching process that stops after a predetermined amount of time lapses.

Example 19. The method of any of examples 14 through 18, wherein the first interlayer dielectric comprises a first oxide layer in contact with the first main surface of the Si substrate, a silicon nitride layer on the first oxide layer, and a second oxide layer on the silicon nitride layer, wherein the second oxide layer is thicker than the first oxide layer, and wherein the etching stops when the silicon nitride layer is detected.

Example 20. The method of any of examples 14 through 19, wherein the first interlayer dielectric is etched in a first region and protected from the etching in a second region such that the air gap is provided in the first region but not in the second region.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate having a first main surface;
a plurality of gate trenches extending from the first main surface into the semiconductor substrate;
a semiconductor mesa between adjacent gate trenches;
a first interlayer dielectric on the first main surface;
a plurality of first metal contacts extending through the first interlayer dielectric and contacting gate electrodes disposed in the gate trenches;
a plurality of second metal contacts extending through the first interlayer dielectric and contacting the semiconductor mesas; and
an air gap or a dielectric material having a lower dielectric constant than the first interlayer dielectric between adjacent first and second metal contacts.

2. The semiconductor device of claim 1, wherein the air gap is between the adjacent first and second metal contacts.

3. The semiconductor device of claim 2, wherein the distance between the adjacent first and second metal contacts occupied by the air gap is less than or equal to 200 nm.

4. The semiconductor device of claim 1, wherein the first metal contacts extend into the gate electrodes and have a first part in the gate electrodes and a second part in the first interlayer dielectric and that is wider than the first part, wherein the second metal contacts extend into the semiconductor mesas and have a first part in the semiconductor mesas and a second part in the first interlayer dielectric and that is wider than the first part, and wherein the air gap or the dielectric material having the lower dielectric constant is between the second part of the adjacent first and second metal contacts.

5. The semiconductor device of claim 4, wherein the first metal contacts further have a third part above the second part and that is wider than the second part, wherein the second metal contacts further have a third part above the second part and that is wider than the second part, and wherein the air gap or the dielectric material having the lower dielectric constant is between both the second part and the third part of the adjacent first and second metal contacts.

6. The semiconductor device of claim 1, wherein the air gap or the dielectric material having the lower dielectric constant has a negative taper relative to the semiconductor substrate such that the air gap or the dielectric material having the lower dielectric constant is wider closer to the semiconductor substrate and narrower further from the semiconductor substrate.

7. The semiconductor device of claim 1, wherein a space between the adjacent first and second metal contacts has an aspect ratio of at least 3:1 where the aspect ratio relates vertical height of the space to lateral width of the space between the adjacent first and second metal contacts.

8. The semiconductor device of claim 1, wherein the first interlayer dielectric comprises a first oxide layer in contact with the first main surface of the semiconductor substrate, a silicon nitride layer on the first oxide layer, and a second oxide layer on the silicon nitride layer, and wherein the second oxide layer is thicker than the first oxide layer.

9. The semiconductor device of claim 1, wherein the first metal contacts comprise tungsten, wherein the second metal contacts comprise tungsten, and wherein the gate electrodes comprise polysilicon.

10. The semiconductor device of claim 1, wherein the first metal contacts, the second metal contacts, and the gate electrodes each comprise tungsten.

11. The semiconductor device of claim 1, wherein each semiconductor mesa includes a source region of a first conductivity type and a body region of a second conductivity type, wherein the source region and the body region included in the same semiconductor mesa form part of a transistor cell, and wherein the transistor cells are electrically connected in parallel to form a transistor.

12. The semiconductor device of claim 1, further comprising a plurality of field plates below and insulated from the gate electrodes in the gate trenches, or in field plate trenches that are separate from the gate trenches.

13. The semiconductor device of claim 1, further comprising:
a second interlayer dielectric on the first interlayer dielectric;
a plurality of third metal contacts extending through the second interlayer dielectric and contacting the first metal contacts; and
a plurality of fourth metal contacts extending through the second interlayer dielectric and contacting the second metal contacts,
wherein a material of the second interlayer dielectric seals the air gap between the adjacent first and second metal contacts.

14. A method of producing a semiconductor device, the method comprising:
forming a plurality of gate trenches extending from a first main surface of a semiconductor substrate into the semiconductor substrate such that a semiconductor mesa is arranged between adjacent gate trenches;
forming a first interlayer dielectric on the first main surface;
forming a plurality of first metal contacts extending through the first interlayer dielectric and contacting gate electrodes disposed in the gate trenches;
forming a plurality of second metal contacts extending through the first interlayer dielectric and contacting the semiconductor mesas; and
forming an air gap or a dielectric material having a lower dielectric constant than the first interlayer dielectric between adjacent first and second metal contacts.

15. The method of claim 14, wherein forming the air gap comprises:
etching the first interlayer dielectric between the adjacent first and second metal contacts; and
after the etching, depositing an oxide using a chemical vapor deposition process or by sputtering,
wherein the oxide seals the air gap between the adjacent first and second metal contacts.

16. The method of claim 15, further comprising:
continuing the chemical vapor deposition process or the sputtering after the oxide seals the air gap between the adjacent first and second metal contacts, to form a second interlayer dielectric on the first interlayer dielectric.

17. The method of claim 16, further comprising:
forming a plurality of third metal contacts extending through the second interlayer dielectric and contacting the first metal contacts; and
forming a plurality of fourth metal contacts extending through the second interlayer dielectric and contacting the second metal contacts.

18. The method of claim 14, wherein the etching is implemented as a timed etching process that stops after a predetermined amount of time lapses.

19. The method of claim 14, wherein the first interlayer dielectric comprises a first oxide layer in contact with the first main surface of the semiconductor substrate, a silicon nitride layer on the first oxide layer, and a second oxide layer on the silicon nitride layer, wherein the second oxide layer is thicker than the first oxide layer, and wherein the etching stops when the silicon nitride layer is detected.

20. The method of claim 14, wherein the first interlayer dielectric is etched in a first region and protected from the etching in a second region such that the air gap is provided in the first region but not in the second region.

* * * * *